(12) United States Patent
Jandzio et al.

(10) Patent No.: US 7,342,801 B2
(45) Date of Patent: Mar. 11, 2008

(54) PRINTED WIRING BOARD WITH ENHANCED STRUCTURAL INTEGRITY

(75) Inventors: Gregory M. Jandzio, Melbourne, FL (US); Anders P. Pedersen, Palm Bay, FL (US); Gary A. Rief, Melbourne, FL (US); Walter M. Whybrew, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 560 days.

(21) Appl. No.: 10/835,251

(22) Filed: Apr. 29, 2004

(65) Prior Publication Data

US 2005/0243527 A1    Nov. 3, 2005

(51) Int. Cl.
*H05K 7/02* (2006.01)
*H05K 7/06* (2006.01)
*H05K 7/08* (2006.01)
*H05K 7/10* (2006.01)

(52) U.S. Cl. ............... 361/760; 361/780; 361/782

(58) Field of Classification Search ........ 361/780–782; 343/700 MS, 853, 895
See application file for complete search history.

(56) References Cited

U.S. PATENT DOCUMENTS

| | | | |
|---|---|---|---|
| 4,318,954 A | 3/1982 | Jensen | 428/209 |
| 5,073,840 A | 12/1991 | Coors | 361/400 |
| 5,151,769 A | 9/1992 | Immorlica, Jr. et al. | 357/53 |
| 5,677,515 A | 10/1997 | Selk et al. | 174/255 |
| 5,724,048 A * | 3/1998 | Remondiere | 343/700 MS |
| 6,018,463 A | 1/2000 | Winslow et al. | 361/803 |
| 6,166,705 A * | 12/2000 | Mast et al. | 343/853 |
| 6,373,447 B1 * | 4/2002 | Rostoker et al. | 343/895 |
| 6,392,164 B1 | 5/2002 | Iwaki et al. | 174/262 |
| 6,444,922 B1 | 9/2002 | Kwong | 174/261 |
| 6,515,222 B2 | 2/2003 | Underwood et al. | 174/35 R |
| 6,657,592 B2 * | 12/2003 | Dening et al. | 343/700 MS |
| 2002/0015293 A1 | 2/2002 | Akiba et al. | 361/793 |
| 2003/0047353 A1 | 3/2003 | Yamaguchi et al. | 174/260 |

* cited by examiner

*Primary Examiner*—Tuan T. Dinh
(74) *Attorney, Agent, or Firm*—Allen, Dyer, Dopplet, Milbrath & Gilchrist, P.A.

(57) ABSTRACT

A structural printed wiring board panel includes a multilayer printed wiring board having opposing, outer faces and interlayer interconnects that route RF, power and control signals. Connection areas are formed in or on at least on one face for connecting the interlayer interconnects and any electrical components. A metallic face sheet is secured onto at least one outer face, adding structural rigidity to the multilayer printed wiring board. A metallic face sheet can have apertures positioned to allow access to connection areas. RF components can be carried by a face sheet and operatively connected to connection areas. Antenna elements can be positioned on the same or an opposing face sheet and operatively connected to RF components to form a phased array printed wiring board (PWB) panel.

13 Claims, 10 Drawing Sheets

PRINTED WIRING BOARD WITH ENHANCED STRUCTURAL INTEGRITY

FIELD OF THE INVENTION

The present invention relates to the field of printed wiring boards, and more particularly, this invention relates to a printed wiring board (PWB) panel that has enhanced structural integrity.

BACKGROUND OF THE INVENTION

Lightweight, low cost printed wiring board panels used in planar or conformal phased array avionic applications, high speed digital boards, and power distribution boards, for example, require easy interconnect, continuous ground planes and optimized thermal and structural performance. Manufacturing very large surface area boards associated with phased array antenna arrays provides several challenges. For example, the radio frequency, control and power signals must be distributed over a large area. Array or other different self-supporting panels must provide low weight per unit area and be manufactured and assembled in an efficient manner without undue interconnect complexity.

Some prior art printed wiring boards are formed as circuit card assemblies (CCA) and include dedicated structural panels required to support the electronics. Manual labor often is required for assembling these panels and electronics, typically using screws or similar fasteners. Ground springs are also often required for grounding support. Because discrete radio frequency (RF), power and control signals must be distributed (or routed) throughout the board, these multiple circuit card assemblies require specialized assembly processes. Extensive interconnects integrate different boards, often requiring a high parts count, adding to the documentation, procurement and logistic difficulties associated with the development, manufacture and sale of such boards. Antenna elements and feed networks also require complex grounding. These boards overall only have a modest weight efficiency.

There have been some proposals to provide a lightweight, low cost integrated and distributed circuit card assembly. Some of these approaches still maintain a low structural integrity, however. These proposals often produce circuit card assemblies having limited environmental robustness and mandate a larger number of mounting points per card to secure the card to a housing or other support structure. These proposals also have a low weight efficiency and use surface mounted discrete components and radio frequency (RF) "modules."

Some current circuit card assembly fabrication techniques attach the board to heat sinks or housings, via fasteners or adhesive bond lines. For example, some metallic heat sinks are laminated to printed wiring boards, but this assembly process does not provide intimate electrical contact even if accomplished with electrically conductive adhesives. Some conductive adhesives have a low shear efficiency and yield assemblies with poor stiffness and strength. Some printed wiring boards have copper metallic layers, but these layers have contributed little to the printed wiring board structure because of their limited thickness and low specific stiffness in design. Other boards have poor coefficient of thermal expansion (CTE) with devices and/or other board materials forming the overall circuit card assembly.

SUMMARY OF THE INVENTION

It is therefore an object of the present invention to provide a structural printed wiring board panel that can be used in a circuit card assembly that incorporates all electrical functions and provides enhanced structural performance, overcoming the disadvantages of the prior art indicated above.

The present invention is a large structural printed wiring board that incorporates all the electrical functions of smaller, less rigid prior art printed wiring boards used in circuit card assemblies. In one aspect of the present invention, an external metallic skin or face sheet is secured, such as by adhesive lamination, to each face of a multilayer printed wiring board (although only one face is possible) for enhanced structural performance. The face sheet also is operative as a ground plane layer. This provides excellent structural properties because the face sheets contribute high stiffness at outer bending fibers forming a board. The face sheets also spread heat, providing superior thermal performance. Because the face sheets carry substantial structural load, the overall printed wiring board has a lower weight when RF components and patch antenna elements are added, forming the circuit card assembly.

With the present invention, standard printed wiring board facilities and manufacturing processes can be used to build a single printed wiring board to replace the use of many printed wiring boards. Selective plating can be used for component mounting and interconnects. Plating can also be used to electrically connect the face sheets to any underlying printed wiring board and provide good RF ground plane functionality and enhanced heat transfer.

In accordance with the present invention, a structural printed wiring board (PWB) panel of the present invention includes a multilayer printed wiring board having opposing outer faces and interlayer interconnects that route RF, power and control signals. The interlayer interconnects can be surface interconnects. Connection areas are formed on at least one face for connecting interlayer interconnects and any electrical components of the multilayer printed wiring board. A metallic face sheet is secured onto at least one opposing outer face, adding structural rigidity to the multilayer printed wiring board. In one aspect of the present invention, each opposing outer face includes a face sheet. Each face sheet has apertures that are formed to allow access to connection areas from electrical components, such as RF components or antenna elements, mounted on the face sheets.

RF components can be carried by a face sheet and operatively connected to connection areas through one or more apertures. Antenna elements can be positioned on the same or an opposing face sheet from the RF components and operatively connected to RF components, thus forming a phased array printed wiring board panel.

The phased array printed wiring board panel can also include plated through holes that extend onto or into the multilayer printed wiring board from a metallic face sheet for electrically connecting a metallic face sheet to selected portions of the printed wiring board, forming a common ground. The metallic face sheet also contains apertures which provide access to interlayer interconnects that route RF, power and control signals. A radio frequency element feedthrough can extend through or into the printed circuit board for interconnecting at least one antenna element and an RF component. The connection areas preferably comprise one of surface mount pads, wire bond pads, or plated through holes.

In yet another aspect of the present invention, a beam forming network circuit, such as formed by stripline, can be formed in the multilayer printed circuit board. At least one RF component is carried by the face sheet and operatively connected to the beam forming network. The face sheets can also be formed from beryllium, aluminum beryllium, copper, beryllium copper, titanium, or a multiple plated material, and could include a combination of beryllium with other materials, including titanium, copper, and aluminum. There could be plated copper face sheets or other materials, depending on the size of the boards. There could be non-metallic plated materials, for example, a Kevlar reinforced material plated with copper, as an example.

In yet another aspect of the present invention, the RF components can be RF modules or control application specific integrated circuits (ASICs), as non-limiting examples.

In yet another aspect of the present invention, the face sheets are about 3 to about 25 mils thick, as non-limiting examples. Each layer forming the multilayer printed wiring bard is preferably about 2 to about 30 mils thick, as non-limiting examples. Power and control wire bonds can extend from RF components to connection areas. The face sheets are preferably secured by adhesive lamination to the multilayer printed wiring board and ground vias extend to or through the multilayer printed wiring board. Blind vias can be included.

A phased array antenna structure is also disclosed and a method of forming a printed wiring board of the present invention.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

The present invention is a large structural printed wiring board that incorporates all the electrical functions of smaller, less rigid prior art printed wiring boards, which include various electrical components, forming circuit card assemblies. The present invention uses an external metallic skin or face sheet secured, such as by adhesive lamination, to each side or face of the printed wiring board (although only one face sheet is necessary) for enhanced structural performance. The metallic face sheet also is operative as a ground plane layer. The metallic face sheets provide excellent structural properties because the face sheets contribute high stiffness at outer bending fibers. The face sheets also spread heat, providing superior thermal performance. Because the face sheets carry substantial structural load, the overall printed wiring board has a lower weight.

With the present invention, standard printed wiring board facilities and manufacturing processes can be used to build a single printed wiring board to replace the use of many printed wiring boards. Selective plating can be used for component mounting and interconnects. Plating can also be used to electrically connect the face sheets to any underlying printed wiring board and provide good RF ground plane functionality and enhanced heat transfer.

Figure 1:
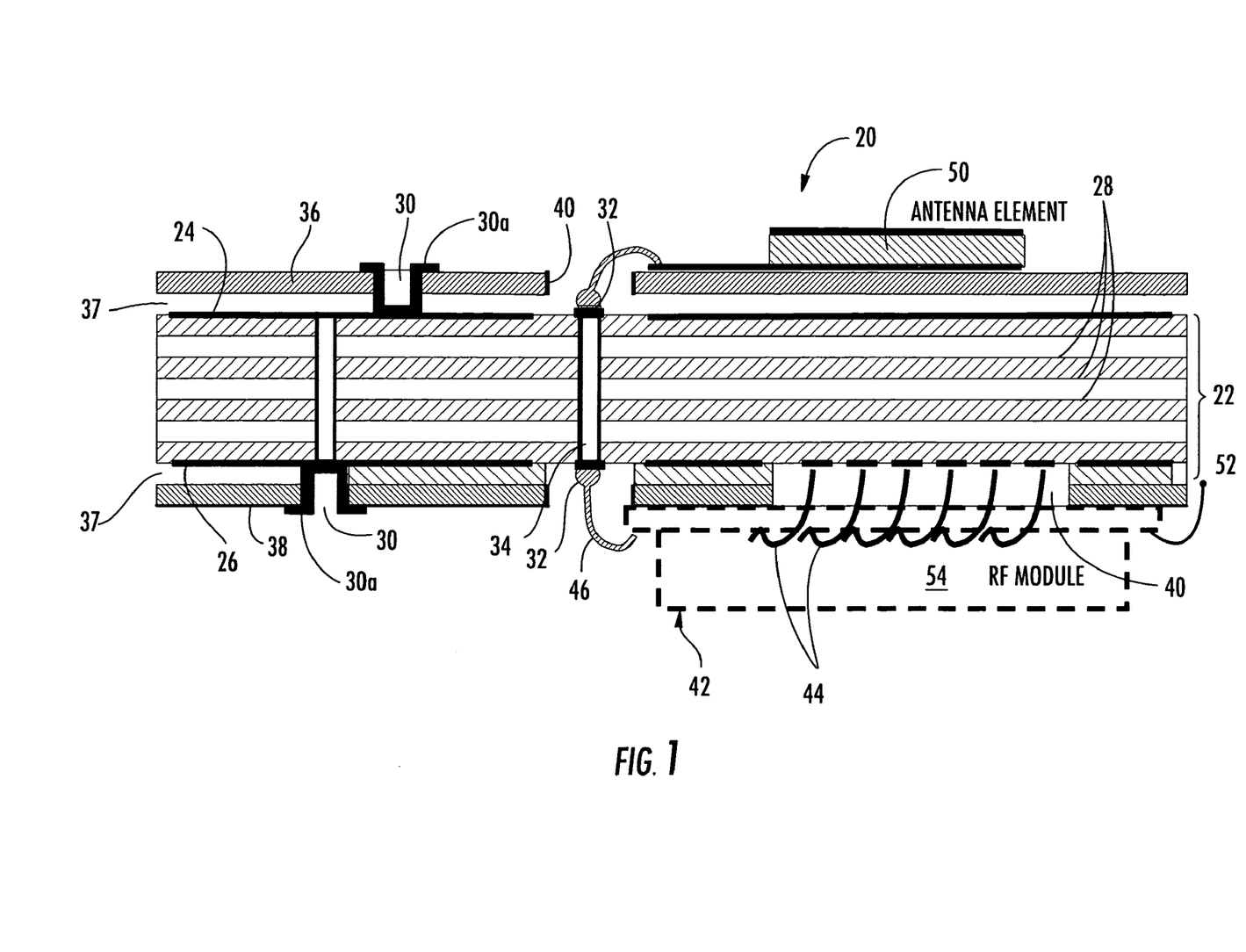
FIG. 1 is a fragmentary, sectional view of an example of a phased array printed wiring board (PWB) panel of the present invention.
Figure 2:
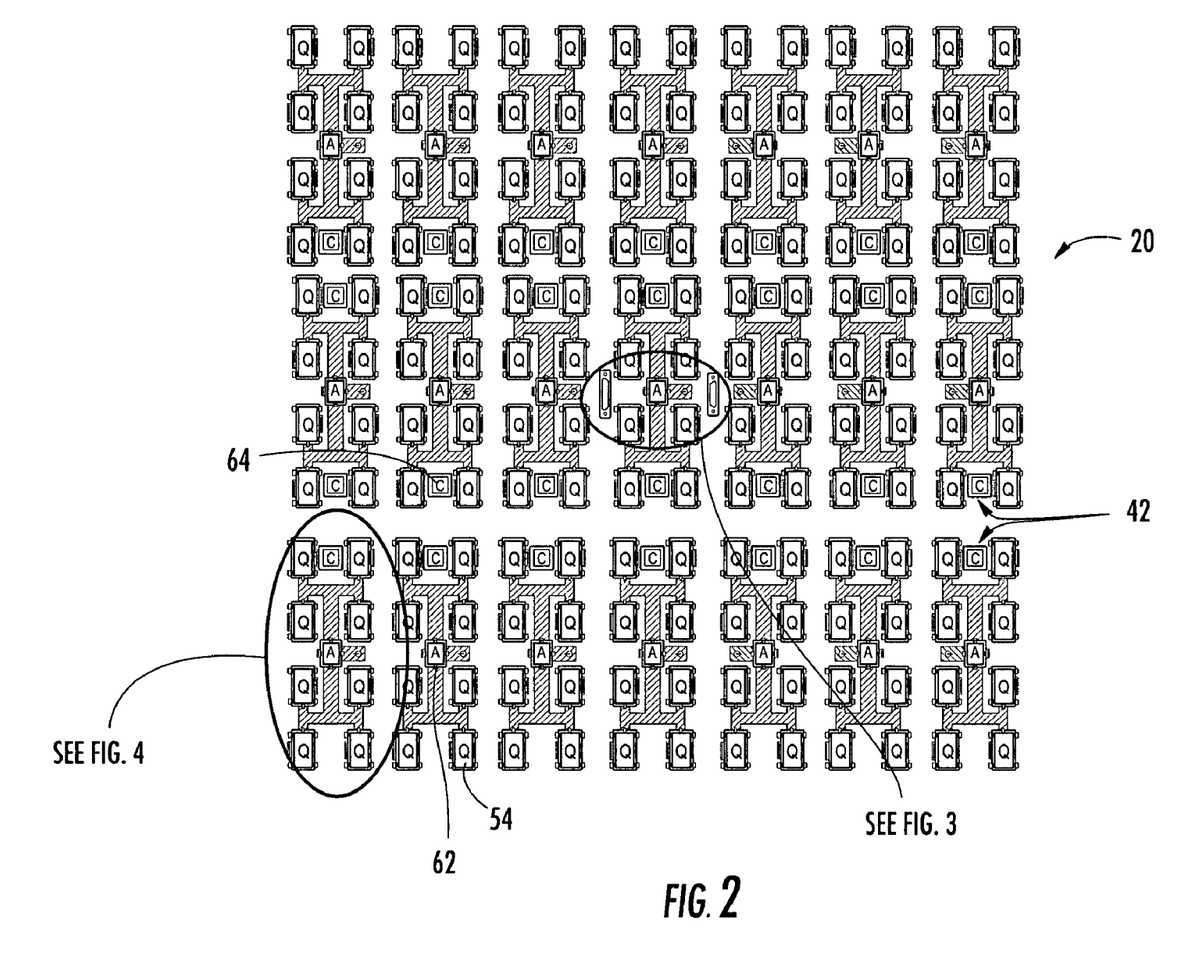
FIG. 2 is a bottom plan view of an example of a phased array printed wiring board (PWB) panel, looking in the direction of arrow 2 in FIG. 1.
Figure 3:
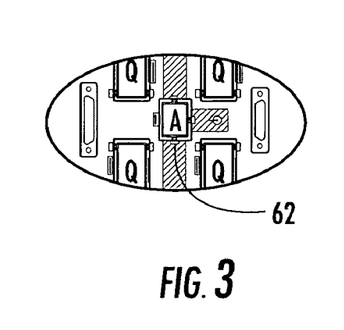
FIG. 3 is an enlarged plan view of the central circled area in FIG. 2.

FIG. 1 shows a fragmentary, sectional view of an example of the structural printed wiring board (PWB) panel 20 of the present invention, formed as a phased array structural printed wiring board panel used as a circuit card assembly in various applications. As illustrated, a multilayer printed wiring board 22 is formed by multiple layers of material (could be dielectric or other material known to those skilled in the art) forming a printed wiring board using printed wiring board manufacturing techniques known to those skilled in the art. In this embodiment as a non-limiting example, eight separate circuit layers are pressed together and bonded in a lamination. Each circuit layer is typically about 2 to about 30 mils thick in the present example. The thickness of each layer can vary, of course, depending on end-use applications and the applied manufacturing techniques. The board includes opposing outer faces 24, 26 and interlayer interconnects 28, including surface layer interconnects, which route RF, power and control signals. Ground vias 30 are formed within the board.

Blind vias can be formed that extend to the underlying surface of the board. Vias can extend all the way through the board. One mil of copper or other material can be added as indicated at 30*a* in FIG. 1. An internal via can be created before the face sheets are laminated. Once face sheets are applied, the blind vias can be formed, such as by plating 30*a*. If an aperture in the face sheet is aligned with a via, this could be plated through, resulting in grounds connected together, creating connectivity. The layer of copper 30*a* can be subsequently applied and selectively applied such that copper is not plated everywhere or on the panel. Connection areas 32 can be formed on at least one face (preferably both faces) for connecting to interlayer interconnects and any electrical components of the multilayer printed wiring board. These connection areas 32 can be formed as surface mount pads, wire bond pads, wiring board bonds, plated through holes, or other means. An RF element feedthrough 34, which could be plated, extends through the multilayer printed wiring board in this example.

In accordance with one example of the present invention, the preferred metallic face sheets 36, 38 are secured onto each respective opposing outer face 24, 26 of the circuit card assembly, adding structural rigidity to the multilayer circuit card assembly. The metallic face sheets, in this example of the present invention, are about 3 to about 25 mils thick, forming a composite panel. The face sheets can be added in a second stage of an adhesive lamination process, after forming the printed wiring board in a first step. Adhesive layer 37 is shown in FIG. 1, and used for securing sheets in adhesive lamination. Typically, the face sheets can be rolled from thick stock and applied by standard printed wiring board manufacturing methods. In a preferred aspect of the present invention, the metallic face sheet is formed from beryllium, aluminum beryllium, copper, beryllium copper, titanium, or a multiple plated material and could include a combination of beryllium with other materials, including titanium, copper, and aluminum. If beryllium is used, a beryllium metal matrix has been found advantageous. There could be plated copper and other materials depending on the size of the boards. There could be non-metallic plated materials, for example, plated with copper. In one aspect, the face sheet is a beryllium metal matrix.

In accordance with the present invention, apertures 40 are formed in each metallic face sheet 36, 38 and positioned to allow access to connection areas on the faces 32 of the printed wiring board. These apertures 40 are typically formed before laminating the metallic face sheet onto the printed wiring board.

As illustrated, RF components 42, for example, RF modules, are carried by a metallic face sheet typically forming a lower or bottom face and adjacent the connection areas 32 and operatively connected through apertures 40 typically by power and control wire bonds 44 or radio frequency input/output wire bonds 46, such as connected to the RF element feedthrough 34 that extends through the printed wiring board. Antenna elements 50 are positioned on the opposing metallic face sheet from the RF components and operatively connected to the RF components, such as by the RF element feedthrough 34. The antenna elements can be patch antenna elements, as an example. An RF component can be connected to a radio frequency beam forming network 52 that is formed on the printed wiring board, such as formed by stripline, as illustrated in FIG. 1.

Figure 4:
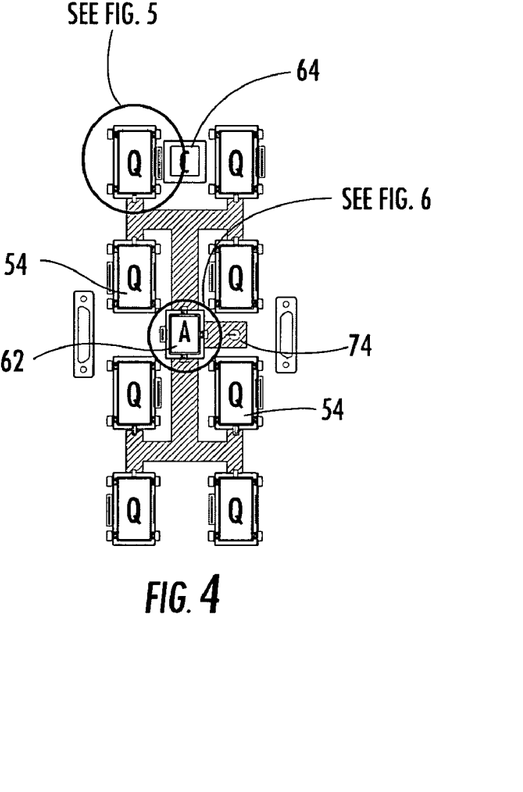
FIG. 4 is an enlarged plan view of the circled area in FIG. 2.
Figure 5:
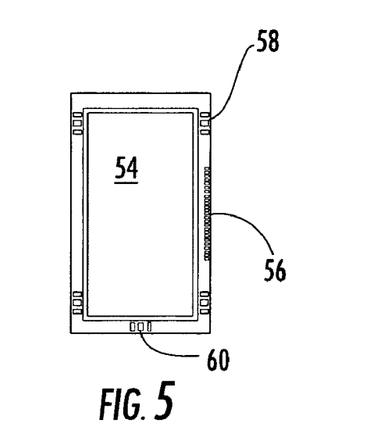
FIG. 5 is an enlarged plan view of the RF module shown in FIG. 4.
Figure 6:
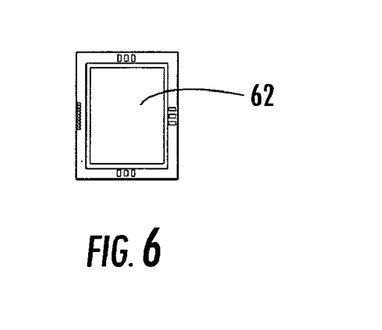
FIG. 6 is an enlarged plan view of an element gain amplifier shown in FIG. 4.

As shown in FIGS. 2-6, the different radio frequency (RF) components 42 could include RF modules 54 (FIG. 5) having a power and control input/output connection area 56, a patch input/output connection area 58, and a cell input/output connection area 60. These connection areas could be solder, wire bonding and a place which has an attached connector. In FIG. 5, patch antenna elements 50 positioned on the opposing side of the board are shown in circular outline. Element gain amplifiers 62 and control application specific integrated circuits (ASIC's) 64 are also mounted on the board. RF components are operative with a controller 70 (FIG. 9), which controls the various RF components and antenna elements, including any beam forming network. FIG. 4 shows RF input/output connection area 74.

Figure 7:
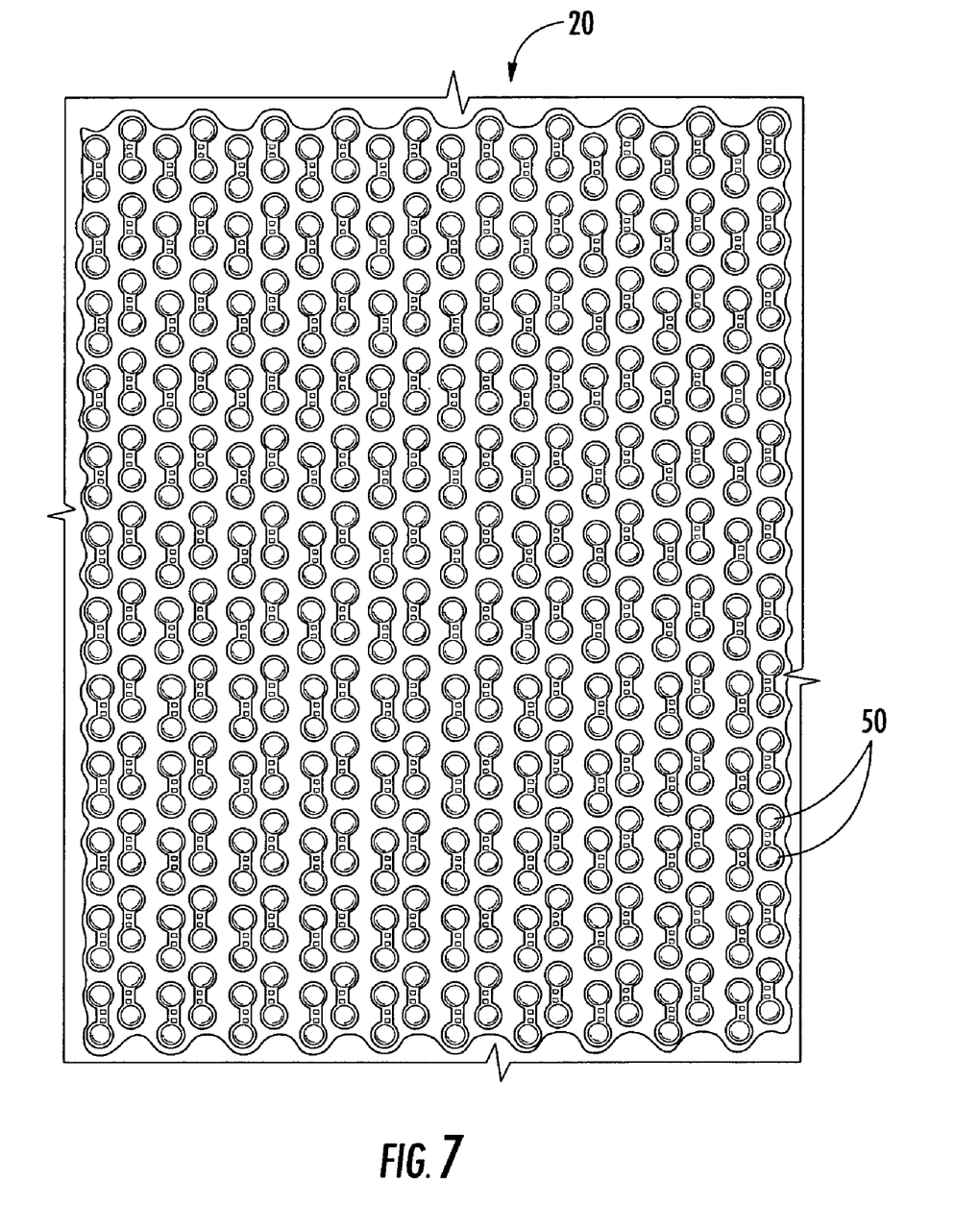
FIG. 7 is a top plan view of an example of a phased array printed wiring board (PWB) panel and showing a plurality of antenna elements positioned on a top face sheet.
Figure 15:
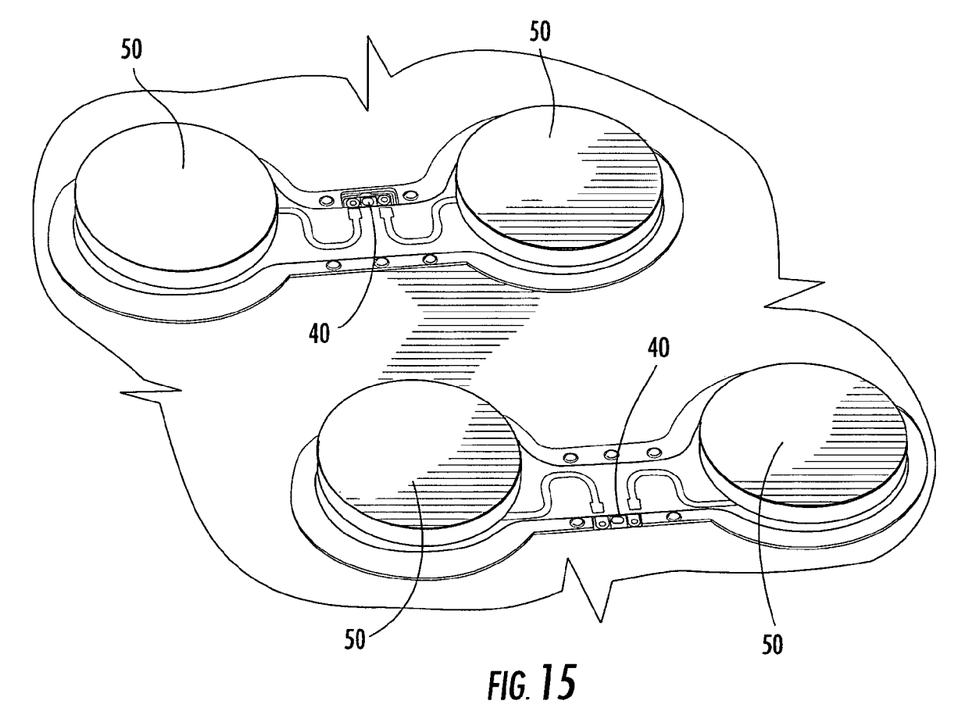
FIG. 15 is an enlarged perspective view of antenna elements positioned on a metallic face sheet and electrical interconnects extended from antenna elements to the printed wiring board via apertures formed on the metallic face sheet.

FIG. 7 shows a number of antenna elements 50 positioned on the top metallic face sheet of the printed wiring board panel and showing in FIG. 15 apertures 40 formed in the face sheet through which electrical connections, such as by wire bonds, are made to the printed wiring board and any plated through holes, surface mount pads, wire bond pads or other connection methodology.

Figure 8:
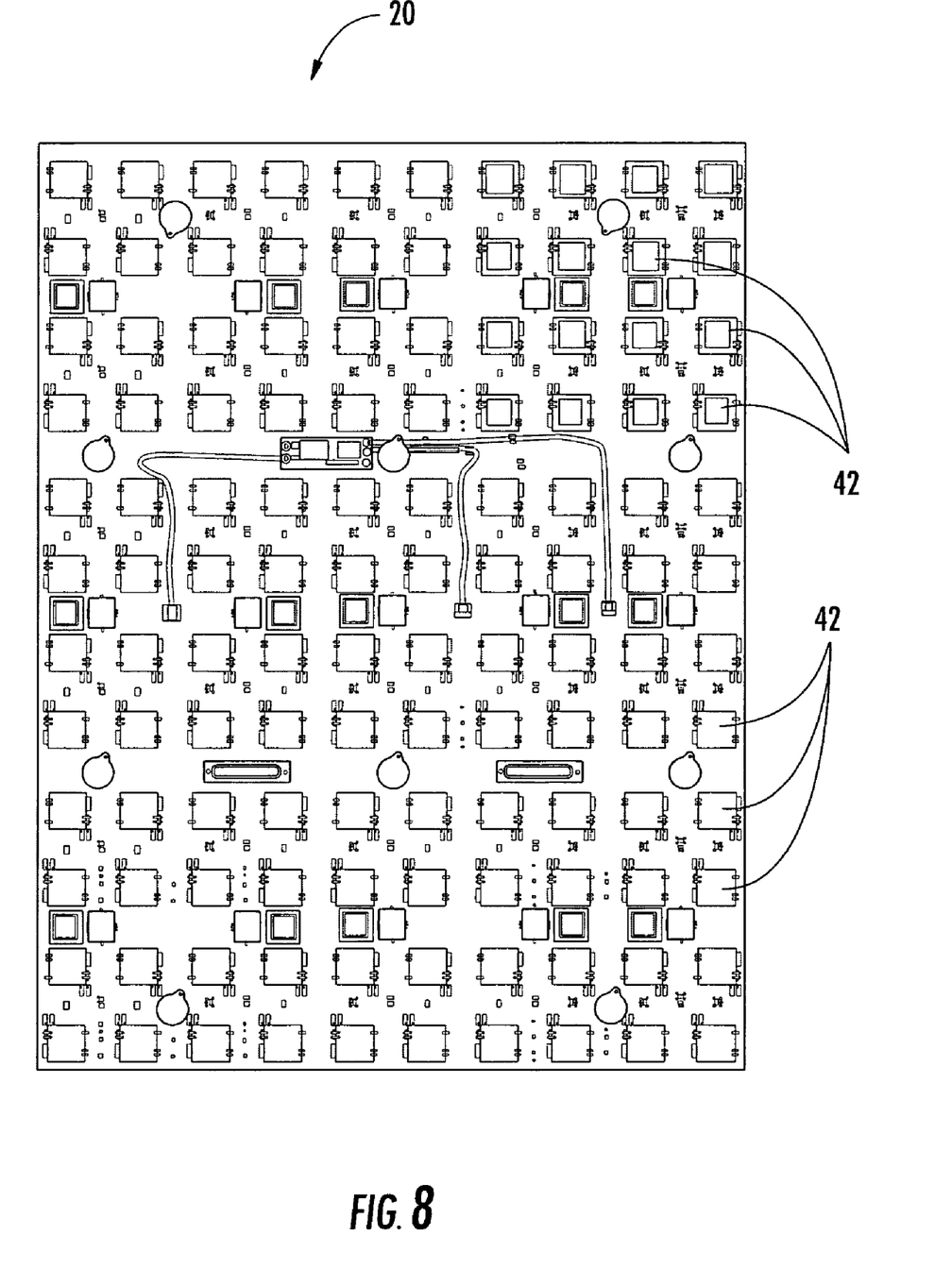
FIG. 8 is a bottom plan view of the phased array printed wiring board (PWB) panel similar to FIG. 2 and showing numerous RF components mounted on the metallic face sheet.

FIG. 8 is a bottom plan view of the phased array printed wiring board (PWB) panel showing numerous RF components as explained before. FIGS. 11-14 show how the apertures 40 in the metallic face sheet allow access to various connection areas, which could include surface mount pads, wire bond pads, plated through holes, or other connecting techniques between the electronic and other RF components and printed wiring board.

Figure 9:
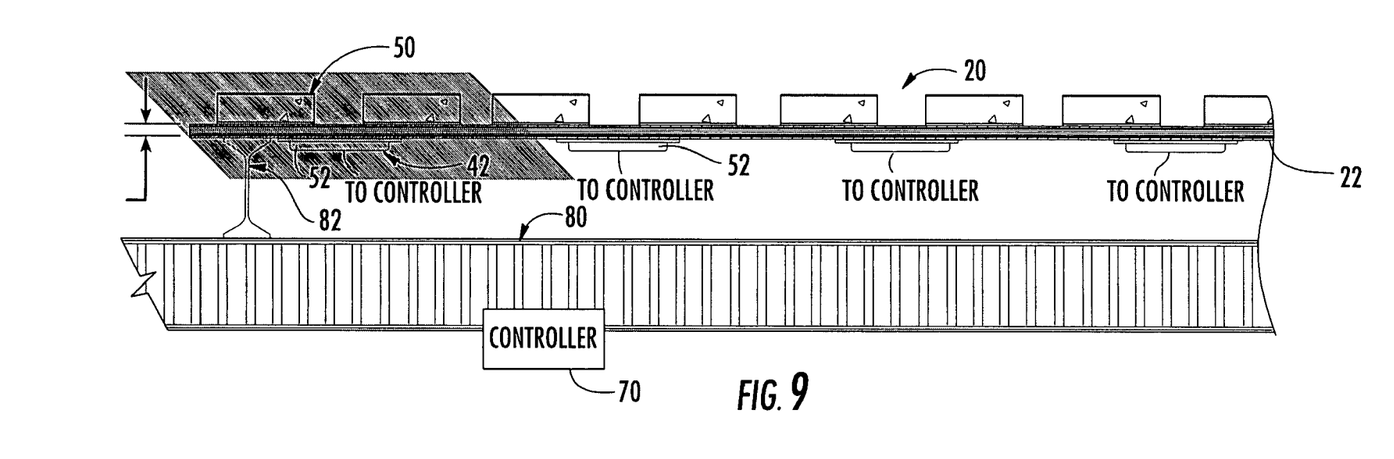
FIG. 9 is a fragmentary, sectional view of a phased array antenna structure showing a support structure, controller and phased array printed wiring board (PWB) panel secured to the structure using flexure supports.
Figure 10:
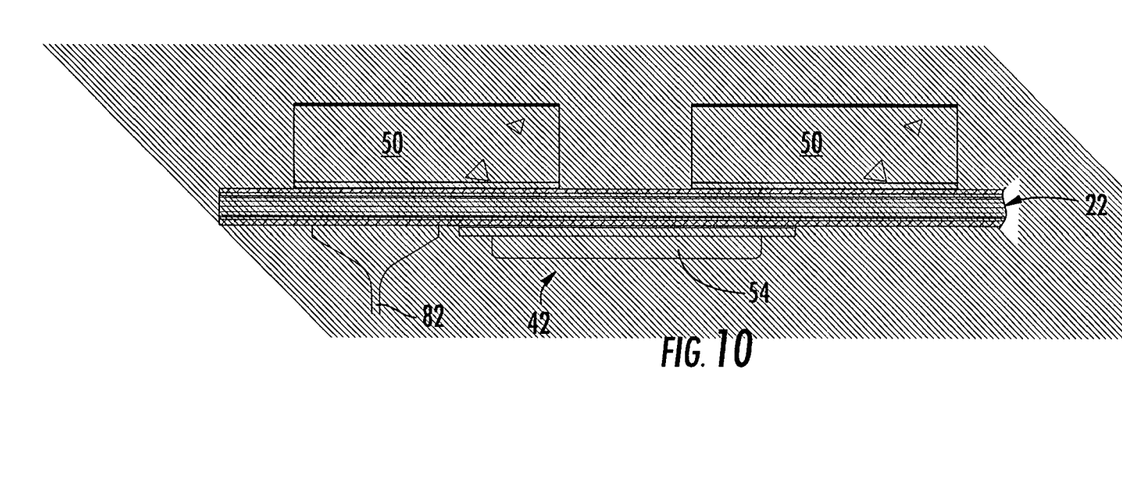
FIG. 10 is an enlarged view of a portion of the phased array antenna structure shown in FIG. 9.
Figure 11:
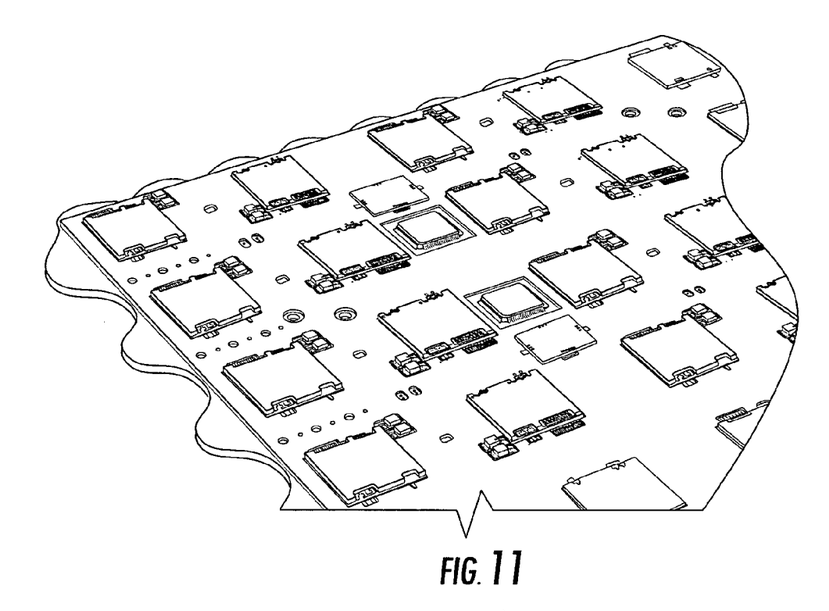
FIGS. 11-14 are perspective views showing various RF components mounted on a face sheet as in FIG. 2 and showing in greater detail some of the apertures which allow access from RF components to connection areas of the printed wiring board.
Figure 12:
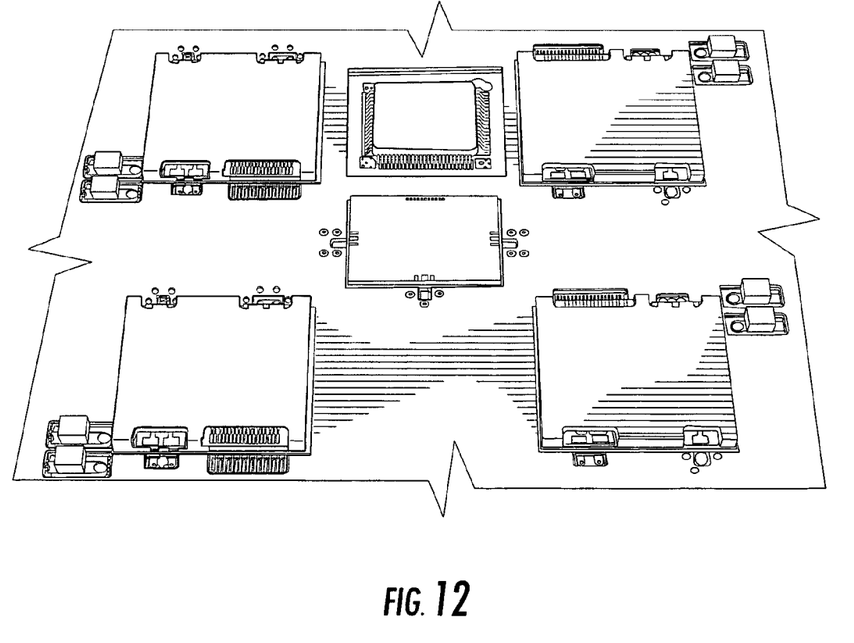
Figure 13:
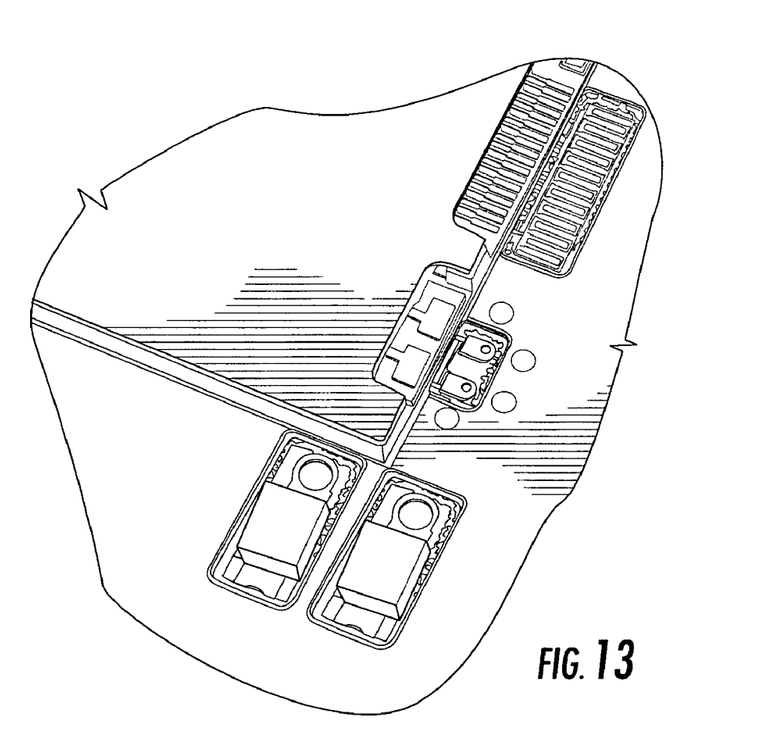
Figure 14:
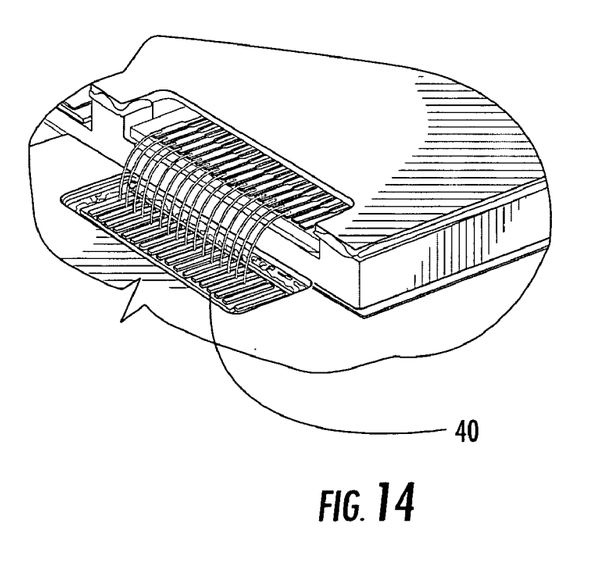

FIGS. 9 and 10 show details of a support structure 80, such as a housing, which could be a honeycomb support structure, aluminum backing, or other structural element. These may not have the same CTE, and thus require a flexure connection 82, which connect the printed wiring board panel of the present invention to the support structure. This accommodates thermoelastic differences between the panel forming, for example, a circuit card assembly.

Figure 16:
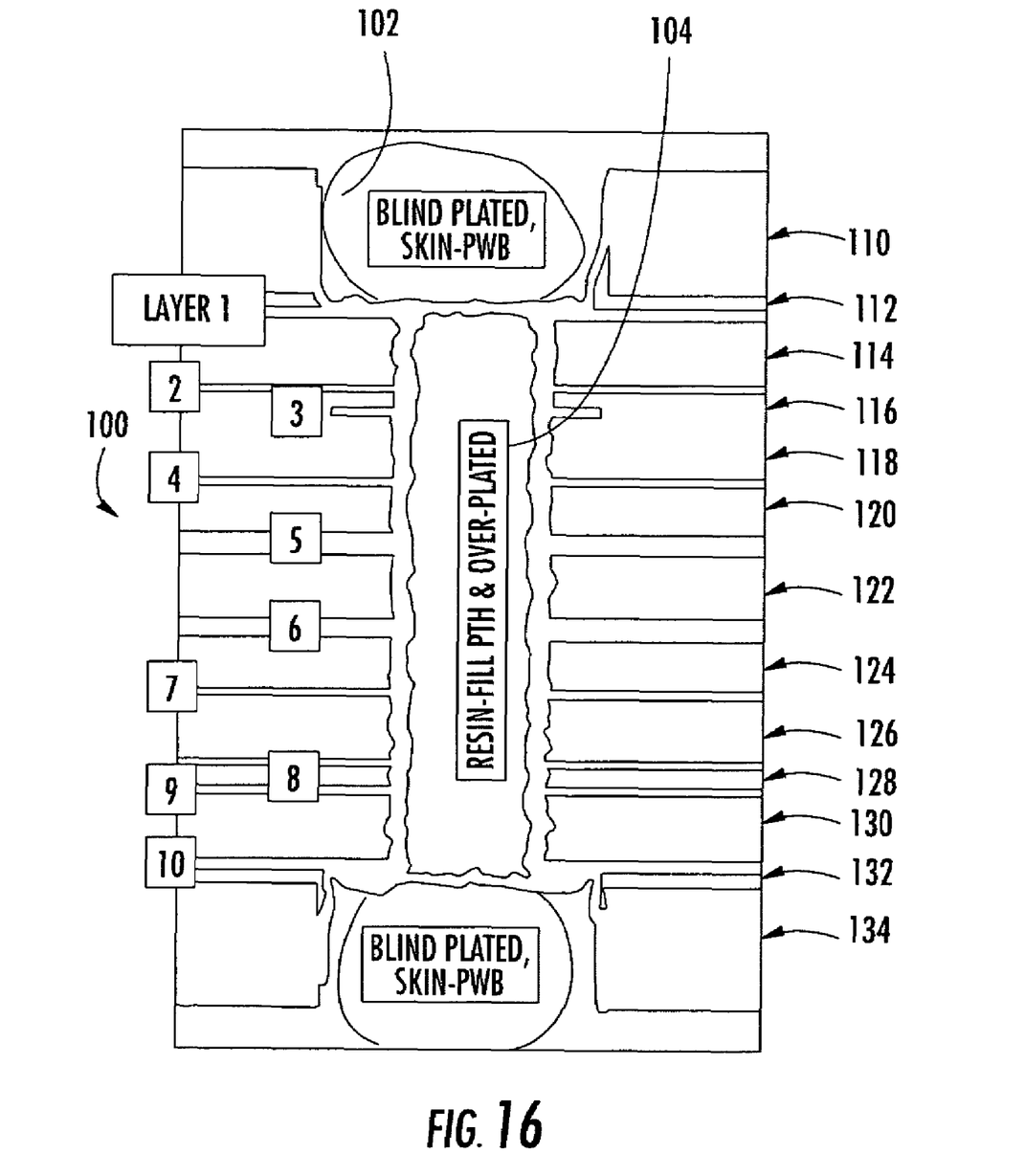
FIG. 16 is a sectional view showing another example of the structural printed wiring board of the present invention.

FIG. 16 is a sectional view of a ten layer structural printed wiring board panel 100, as one non-limiting example, and showing blind plated skin-PWB 102 and the ten layers numbered 1-10. A resin-fill plated through hole and overplated portion 104 extend through a medial portion as illustrated. Different layers are number 110-134 and in this non-limiting example, correspond as follows:

| | |
|---|---|
| 110 | Skin, 12 mils nom; copper sheet |
| 112 | GI prepreg, 5 mils nom/2.5 min; Hitachi GIA-671N |
| 114 | 8 mil core; Rogers 4003, ½/½ |
| 116 | Prepreg, 4 mils nom/2.5 mils min; Rogers 4403 |
| 118 | 8 mil core; Rogers 4003, ½/½ |
| 120 | GF prepreg, 3.5 mils min; IPC-4101 |
| 122 | 8 mil core; Rogers 4003, 2/2 |
| 124 | GF prepreg, 3.5 mils min; IPC-4101 |
| 126 | 8 mil core; Rogers 4003, ½/½ |
| 128 | Prepreg, 4 mils nom/2.5 mils min; Rogers 4403 |
| 130 | 8 mil core; Rogers 4003, ½/½ |
| 132 | GI prepreg, 5 mils nom/2.5 min; Hitachi GIA-671N |
| 134 | Skin, 12 mils nom; copper sheet |

The present invention is advantageous such that the greater rigidity of the structural printed wiring board panel allows fewer flexure connections. Also, the present invention provides high fidelity, RF ground planes through the multiple blind vias connections with enhanced printed wiring board stiffness enabling environmental robustness. It also facilitates mounting of an interface to the backside supporting structure and supports additional radio frequency and power and control entities. Discrete printed wiring board and parts counts can be reduced and assembly handling facilitated.

Because the structural metallic face sheet or outer skin is laminated, typically adhesively, as part of the printed wiring board fabrication process, electrical conductivity can be achieved via standard printed wiring board fabrication processing. An assembly can be delivered to a third party or other part of the assembly process for population with electronic components. Use of some metals, for example, AlBeMet, copper, or titanium (TI), provide a nearly homogenous structure with regard to thermal expansion coefficients, resulting in highly reliable through holes in an extremely stiff printed wiring board.

The phased array printed wiring board panel can be used in various RF and antenna panels. The board could also be used in different flat and conformal applications. It can be used in space-based radar systems, dual use applications programming (DUAP) systems, innovated space-based radar antenna technologies (ISAT) systems, DDX and DUST systems. It is also possible to use the present invention in electronic enclosures with high power avionic applications, high dynamic environments and RF grounding critical boards. The board can be rigid enough in some applications to be part of a housing or enclosure wall.

It should be understood that the outer skin or metallic face sheet is technically not required to be metal, but could be any type of ground plane, for example, a non-metallic material that is conductive by plating. This could include a Kevlar reinforced material plated with copper. The printed wiring board panel can be formed as large as or greater than two by two feet. The use of beryllium or aluminum beryllium from a manufacturer such as Brush Wellman provides adequate support and structure for the panel, although other materials could be used as discussed above. The beryllium or other material face sheet, once rolled to a desired thickness, can be perforated at predetermined locations and shipped to a printed wiring board builder and later laminated to the printed wiring board. Another layer of copper could be added and a plating bath could be used to plate holes to form plated-through-holes (PTH), electrically connecting face sheets, and the underlying printed wiring board. The metallic face sheet also forms a ground plane, which is desirable in these applications.

Because of the higher stiffness afforded the printed wiring board panel of the present invention, it is possible to use fewer points to mount the panel to a stiff structure. There are many packaging benefits with this structure. It is possible to also place capacitors and resistors or other components on the faces of the printed wiring board. It is no longer necessary to bond the board to heat sinks, as in some prior art and smaller boards. It is possible to bond using different printed wiring board materials, including impregnated adhesives in a film form. Holes can be punched and layers stacked with high temperature and pressure applied for lamination as in building conventional printed wiring boards. Manufacturing can also be accomplished off-line and the manufactured boards sent off for plating afterward. It is also possible to use a film or paste adhesive for lamination. Electrical connections can also be accomplished with a conductive epoxy. The flexure connector is an adaptable way to decouple the panel of the present invention from a back-up structure that supports an array. The back-up structure does not have to be as stiff as prior art back-up structures because of the present invention. One preferred material, in one aspect, is aluminum beryllium, although other materials as discussed, including titanium, could also be used.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A phased array printed wiring board (PWB) panel comprising:
    a multilayer printed wiring board having opposing, outer faces and interlayer interconnects that route RF, power and control signals, and connection areas on outer faces for connecting to interlayer interconnects and any electrical components of said multilayer printed wiring board and feed throughs formed as plated through holes connecting connection areas on opposing outer faces;
    a metallic face sheet secured onto each respective opposing, outer face adding structural rigidity to the multilayer printed wiring board and having apertures positioned to allow access to said connection areas on;
    at least one RF component carried by a face sheet and operatively connected to said connection areas;
    wire bonds operatively connecting said at least one RF component with a connection area through an aperture; and
    at least one antenna element positioned on the opposing face sheet from the at least one RF component and wire bonds operatively connecting said at least one RF component to a connection area for connecting at least one RF component via the feed through.

2. The phased array printed wiring board (PWB) panel according to claim 1, and further comprising plated through holes extending onto or into said multilayer printed wiring board from a metallic face sheet for electrically connecting the metallic face sheet to selected interlayer interconnects.

3. The phased array printed wiring board (PWB) panel according to claim 1, wherein said connection areas comprise one of surface mount or wire bond pads.

4. The phased array printed wiring board (PWB) panel according to claim 1, and further comprising a beam forming network circuit formed in said multilayer printed wiring board, wherein at least one RF component is operatively connected to said beam forming network.

5. The phased array printed wiring board (PWB) panel according to claim 1, wherein said face sheets are formed from plated or unplated metallic material.

6. The phased array printed wiring board (PWB) panel according to claim 1, wherein said face sheets include non-metallic material.

7. The phased array printed wiring board (PWB) panel according to claim 1, wherein said face sheets comprise a beryllium metal matrix.

8. The phased array printed wiring board (PWB) panel according to claim 1, wherein each of said face sheets is about 3 to about 25 mils thick.

9. The phased array printed wiring board (PWB) panel according to claim 1, wherein each layer forming said multilayer printed wiring board is about 2 to about 30 mils thick.

10. The phased array printed wiring board (PWB) panel according to claim 1, and further comprising power and control wire bonds extending from RF components to connection areas.

11. The phased array printed wiring board (PWB) panel according to claim 1, wherein said face sheets are secured by adhesive lamination to said multilayer printed wiring board.

12. The phased array printed wiring board (PWB) panel according to claim 1, and further comprising ground vias extending to or through said multilayer printed wiring board.

13. The phased array printed wiring board (PWB) panel according to claim 4, wherein said beam forming network comprises stripline.

* * * * *